(12) United States Patent
Kim et al.

(10) Patent No.: US 11,923,846 B2
(45) Date of Patent: Mar. 5, 2024

(54) TERNARY LOGIC CIRCUIT

(71) Applicant: UNIST(ULSAN NATIONAL INSTITUTE OF SCIENCE AND TECHNOLOGY), Ulsan (KR)

(72) Inventors: Kyung Rok Kim, Ulsan (KR); Jae Won Jeong, Ulsan (KR); Youngeun Choi, Ulsan (KR); Wooseok Kim, Ulsan (KR); Jae Hyeon Jun, Ulsan (KR)

(73) Assignee: UNIST(ULSAN NATIONAL INSTITUTE OF SCIENCE AND TECHNOLOGY) (KR)

(*) Notice: Subject to any disclaimer, the term of this patent is extended or adjusted under 35 U.S.C. 154(b) by 0 days.

(21) Appl. No.: 17/673,772

(22) Filed: Feb. 16, 2022

(65) Prior Publication Data

US 2022/0407520 A1  Dec. 22, 2022

(30) Foreign Application Priority Data

Jun. 22, 2021 (KR) .................. 10-2021-0081048

(51) Int. Cl.
*H03K 19/00* (2006.01)
*H03K 19/08* (2006.01)
*H03K 19/20* (2006.01)

(52) U.S. Cl.
CPC .............. *H03K 19/08* (2013.01); *H03K 19/20* (2013.01)

(58) Field of Classification Search
CPC .................. H03K 19/08; H03K 19/20
See application file for complete search history.

(56) References Cited

U.S. PATENT DOCUMENTS 4,578,596 A * 3/1986 Tihanyi ............. H03K 17/0826
257/E27.128
8,022,725 B2   9/2011 Kim et al.
(Continued)

FOREIGN PATENT DOCUMENTS

CN      107731254 A   2/2018
KR      101432037 B1  8/2014
KR      101689159 B1  12/2016

OTHER PUBLICATIONS

Kim, S. et al, "A Logic Synthesis Methodology for Low-Powgr Ternary Logic Circuits," *IEEE Transactions on Circuits and Systems-I: Regular Papers*, 6(9):3138-3451 (May 2020).
(Continued)

*Primary Examiner* — Kurtis R Bahr
(74) *Attorney, Agent, or Firm* — Klarquist Sparkman, LLP

(57) ABSTRACT

A ternary logic circuit includes: a first inverter unit; a second inverter unit arranged in parallel with the first inverter unit; a first junction unit arranged between the first inverter unit and an output terminal and including a tunnel PN junction; and a second junction unit arranged between the second inverter unit and the output terminal and including a tunnel PN junction, wherein, when an absolute value of an input voltage applied to an input terminal is less than a first input voltage, the output terminal outputs a first output voltage, and when the absolute value of the input voltage is greater than the first input voltage and less than a second input voltage, the output terminal outputs a second output voltage, and when the absolute value of the input terminal is greater than the second input voltage, the output terminal outputs a third output voltage.

10 Claims, 7 Drawing Sheets

(56) References Cited

U.S. PATENT DOCUMENTS

| | | |
|---|---|---|
| 10,133,550 B2 | 11/2018 | Kim et al. |
| 2008/0290941 A1 | 11/2008 | Ludwig |
| 2022/0109444 A1* | 4/2022 | Kang .................... H10K 10/462 |
| 2022/0352893 A1* | 11/2022 | Kang ........................ G06F 7/38 |

OTHER PUBLICATIONS

Lin, S. et al, "CNTFET-Based Design of Ternary Logic Gates and Arithmetic Circuits," *IEEE Transactions on Nanotechnology*, 10(2):2i 7225 (Mar. 2011).

Razi et al., "A variation-aware ternary spin-Hall assisted STT-RAM based on hybrid MTJ/GAA-CNTFET logic," *IEEE Transactions on Nanotechnology* 18: 598-605, May 2019.

* cited by examiner

TERNARY LOGIC CIRCUIT

CROSS-REFERENCE TO RELATED APPLICATION

This application is based on and claims priority under 35 U.S.C. § 119 to Korean Patent Application No. 10-2021-0081048, filed on Jun. 22, 2021, in the Korean Intellectual Property Office, the disclosure of which is incorporated by reference herein in its entirety.

BACKGROUND

1. Field

One or more embodiments relate to a ternary logic circuit, and more particularly, to a ternary logic circuit having an improved integration degree by using carbon nanotubes.

2. Description of the Related Art

A binary logic-based digital system has an increased bit density, which is obtained by making devices compact in order to process a large amount of data at a high speed. However, as devices have become compact to 30 nm or less and highly integrated, problems of current leakage and increase in power consumption have emerged. To overcome these limitations and increased bit density, the interest in a ternary logic circuit, which is one of multi-valued logics, has increased.

One method to implement a multi-valued logic circuit is to configure a multi-threshold voltage-based circuit. Carbon nanotubes, the threshold voltage of which can be determined by adjusting the diameter thereof, is known as a material suitable for realizing a multi-threshold voltage-based circuit.

KR 10-1689159 (published on Dec. 23, 2016) discloses a ternary logic circuit; a ternary logic circuit according to an embodiment comprising: a pull-up device and a pull-down device connected in series between power voltages (between $V_{-DD}$ and GND); and an input voltage $V_{-IN}$ and an output voltage $V_{-OUT}$. When both of the pull-up and the pull-down devices are turned off by the input voltage $V_{-IN}$, both of the pull-up and the pull-down devices are operated as simple resistance affected only by the output voltage $V_{-OUT}$, and a ternary number (state of "1") is formed through voltage distribution. When current is supplied by turning on only one of pull-up and pull-down devices 100, 200, $V_{DD}$ (state of "2") or GND (state of "0") is output as the output voltage $V_{OUT}$, and accordingly, bit density may be remarkably increased.

However, in related art described above, the ternary logic circuit consists of only a pull-up device and a pull-down device, and thus, transition to each state is slow.

RELATED ART DOCUMENTS

Patent Documents

1. KR 10-1689159 (published on Dec. 23, 2016)

SUMMARY

One or more embodiments include a ternary logic circuit having an improved integration degree.

Additional aspects will be set forth in part in the description which follows and, in part, will be apparent from the description, or may be learned by practice of the presented embodiments of the disclosure.

According to one or more embodiments, a ternary logic circuit includes: a first inverter unit electrically connected to an input terminal and an output terminal; a second inverter unit electrically connected to the input terminal and the output terminal and arranged in parallel with the first inverter unit; a first junction unit arranged between the first inverter unit and the output terminal and including a tunnel PN junction; and a second junction unit arranged between the second inverter unit and the output terminal and including a tunnel PN junction, wherein, when an absolute value of an input voltage applied to the input terminal is less than a first input voltage, the output terminal outputs a first output voltage, and when the absolute value of the input voltage is greater than the first input voltage and less than a second input voltage, the output terminal outputs a second output voltage, and when the absolute value of the input terminal is greater than the second input voltage, the output terminal outputs a third output voltage.

The first inverter unit may include a first transistor having a first threshold voltage and a second transistor that is arranged in series with the first transistor and has a second threshold voltage, the second inverter unit may include a third transistor having a third threshold voltage and a fourth transistor that is arranged in series with the third transistor and has a fourth threshold voltage, and the first transistor and the third transistor may include a p-type channel, and the second transistor and the fourth transistor may include an n-type channel.

An absolute value of the first threshold voltage may be equal to an absolute value of the fourth threshold voltage, and an absolute value of the second threshold voltage may be equal to an absolute value of the third threshold voltage.

The first transistor, the second transistor, the third transistor, and the fourth transistor may include carbon nanotube transistors.

The first transistor and the fourth transistor may include carbon nanotubes having a first diameter, the second transistor and the third transistor may include carbon nanotubes having a second diameter, and the first diameter may be less than the second diameter.

The first junction unit and the second junction unit may include a carbon nanotube tunnel PN junction.

An electric field applied to the carbon nanotube tunnel PN junction may be equal to or greater than 1 MV/cm.

The carbon nanotube tunnel PN junction may have a first region that is highly doped with an n-type dopant and a second region that is highly doped with a p-type dopant.

The carbon nanotube tunnel PN junction may be doped at at least $3\times10^{18}$ cm$^{-3}$.

When the absolute value of the input voltage is greater than an absolute value of the first input voltage and less than an absolute value of the second input voltage, the carbon nanotube tunnel PN junction may distribute a voltage by using a tunneling current.

The first output voltage may have a same magnitude as an operation voltage $V_{DD}$, and the second output voltage may have half the magnitude as the operation voltage $V_{DD}/2$, and the third output voltage may have the same magnitude as a ground voltage.

According to one or more embodiments, a ternary logic circuit includes: a first transistor unit including a first operation electrode, a first common electrode, and a first carbon nanotube channel arranged between the first operation electrode and the first common electrode; a second transistor unit that shares the first common electrode with the first transistor unit and includes a first ground electrode and a second carbon nanotube channel arranged between the first common electrode and the first ground electrode; a third transistor unit including a second operation electrode, a second common electrode, and a third carbon nanotube channel arranged between the second operation electrode and the second common electrode; a fourth transistor unit that shares the second common electrode with the third transistor unit and includes a second ground electrode and a fourth carbon nanotube channel arranged between the second common electrode and the second ground electrode; a gate electrode electrically connected to an input terminal and arranged on respective partial regions of the first carbon nanotube channel, the second carbon nanotube channel, the third carbon nanotube channel, and the fourth carbon nanotube channel; an output electrode electrically connected to an output terminal; a first carbon nanotube junction electrically connected to the first common electrode and the output electrode; and a second carbon nanotube junction electrically connected to the second common electrode and the output electrode.

The first carbon nanotube channel and the fourth carbon nanotube channel may include carbon nanotubes having a first diameter, and the second carbon nanotube channel and the third carbon nanotube channel may include carbon nanotubes having a second diameter, and the first diameter may be less than the second diameter.

The first carbon nanotube channel and the third carbon nanotube channel may include p-type carbon nanotubes, and the second carbon nanotube channel and the fourth carbon nanotube channel may include n-type carbon nanotubes.

The first carbon nanotube junction and the second carbon nanotube junction may respectively include p-type carbon nanotubes doped p-type and n-type carbon nanotubes doped n-type.

The first carbon nanotube junction and the second carbon nanotube junction may be doped at at least $3 \times 10^{18}$ cm$^{-3}$.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
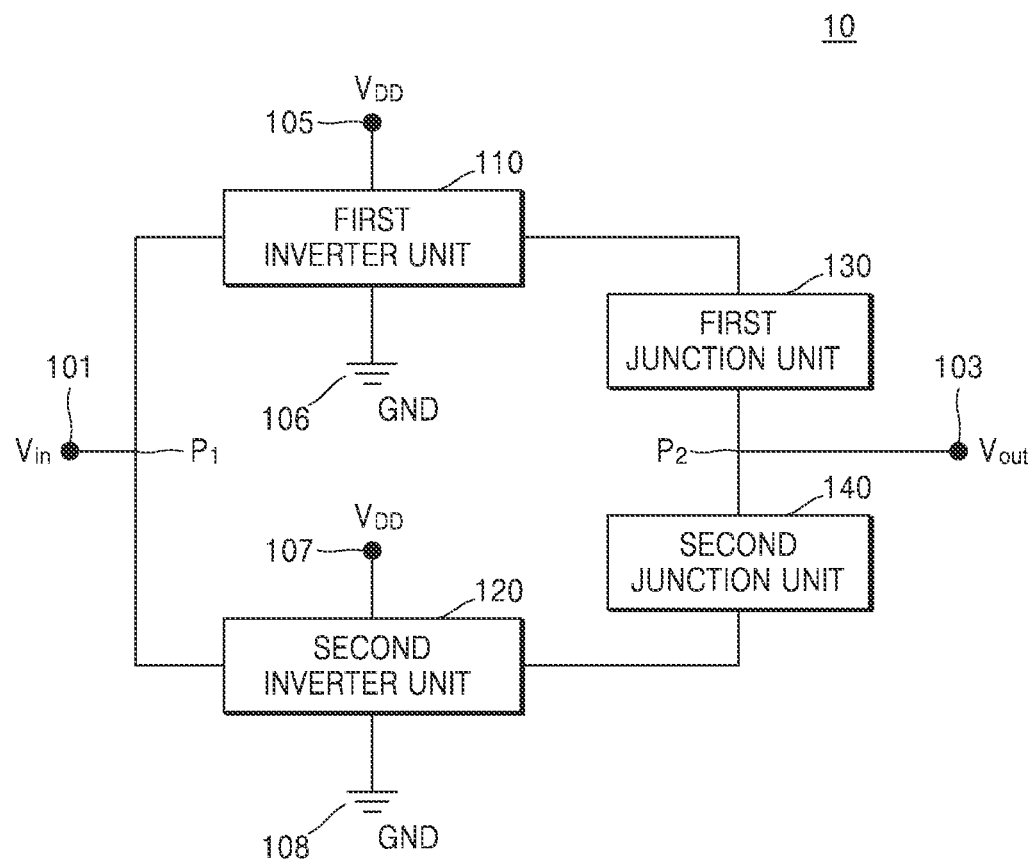
FIG. 1 illustrates a ternary logic circuit according to an embodiment of the present disclosure.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

While the present disclosure allows for various changes and modifications, particular embodiments thereof are illustrated in the drawings, and will be described in detail hereinafter. However, it is not intended to limit the present disclosure to the particular form disclosed, but rather the present disclosure includes all changes, equivalents and substitutions consistent with the spirit of the present disclosure as defined by the claims.

When a constituent element such as a layer, a region, or a substrate is "on" another constituent element, it may be construed that the constituent element is on the other constituent element not only directly but also through at least one of other constituent elements interposed therebetween.

Also, the present disclosure may employ prior art techniques for electronic configuration, signal processing, and/or data processing, and the like. Terms such as "unit", "element", "means" and "feature" may be used broadly, and the components of the present disclosure are not limited to mechanical and physical elements.

Although the terms "first", "second", etc. may be used herein to describe various elements, components, areas, layers, steps and/or regions, it will be understood that these elements, components, areas, layers, steps and/or regions should not be limited by these terms.

Embodiments of the present disclosure are described in detail with reference to the accompanying drawings. Hereinafter, like reference numerals are used for like elements in the drawings, and repeated descriptions of the same elements are omitted.

FIG. 1 illustrates a ternary logic circuit according to an embodiment of the present disclosure.

Referring to FIG. 1, a ternary logic circuit 10 according to an embodiment of the present disclosure includes a first inverter unit 110, a second inverter unit 120, a first junction unit 130, and a second junction unit 140.

The first inverter unit 110 may be electrically connected to an input terminal 101, to which an input voltage Vin is applied, an output terminal 103, from which an output voltage Vout is output, a first operation electrode 105, to which an operation voltage $V_{DD}$ is applied, and a first ground electrode 106.

The first inverter unit 110 may operate in the same manner as a threshold voltage-based binary logic circuit. That is, the first inverter unit 110 may output the operation voltage $V_{DD}$ when an absolute value of the input voltage Vin is less than a first input voltage, and output a ground voltage GND when the absolute value of the input voltage Vin is greater than the first input voltage.

The second inverter unit 120 may be arranged in parallel with the first inverter unit 110, and may be electrically connected to the input terminal 101, to which the input voltage Vin is applied, the output terminal 103, from which the output voltage Vout is output, a second operation electrode 107, to which the operation voltage $V_{DD}$ is applied, and a second ground electrode 108.

Here, parallel connection indicates than elements are arranged in parallel with respect to the input terminal 101 and the output terminal 103.

That is, at a first point $P_1$, the input terminal 101 may branch off into the first inverter unit 110 and the second inverter unit 120 to be electrically connected thereto, and at a second point $P_2$, the first junction unit 130 connected to an output end of the first inverter unit 110 and the second junction unit 140 connected to an output end of the second inverter unit 120 may join each other and be electrically connected to the output terminal 103.

The second inverter unit 120 may operate in the same manner as a threshold voltage-based binary logic circuit. Here, the second inverter unit 120 may output the operation voltage $V_{DD}$ when the absolute value of the input voltage Vin is less than a second input voltage, and output the ground voltage GND when the absolute value of the input voltage Vin is greater than the second input voltage.

The first junction unit 130 may be arranged between the output end of the first inverter unit 110 and the output terminal 103, and the second junction unit 140 may be arranged between the output end of the second inverter unit 120 and the output terminal 103.

The first junction unit 130 and the second junction unit 140 may each include a tunnel PN junction. Here, the tunnel PN junction refers to a highly doped PN junction diode, and may include a PN junction switching fast in forward and reverse directions.

When the absolute value of the input voltage Vin applied to the input terminal 101 is less than the first input voltage, the first inverter unit 110 and the second inverter unit 120 may output the operation voltage $V_{DD}$. Accordingly, a first output voltage Vout may be equal to the operation voltage $V_{DD}$.

When the absolute value of the input voltage Vin applied to the input terminal 101 is greater than the first input voltage and less than the second input voltage, the first inverter unit 110 may output the ground voltage GND, and the second inverter unit 120 may output the operation voltage $V_{DD}$. Here, the first junction unit 130 and the second junction unit 140 may distribute a voltage between both ends thereof by using a tunneling current. Accordingly, the second output voltage Vout may have a half of the magnitude of the operation voltage $V_{DD}$ ($V_{DD}/2$).

When the input voltage Vin applied to the input terminal 101 is greater than the second input voltage, the first inverter unit 110 and the second inverter unit 120 may output the ground voltage GND. Accordingly, a third output voltage Vout may be equal to the ground voltage GND.

Accordingly, according to the ternary logic circuit 10 according to an embodiment of the present disclosure, three types of output states may be implemented.

Figure 2:
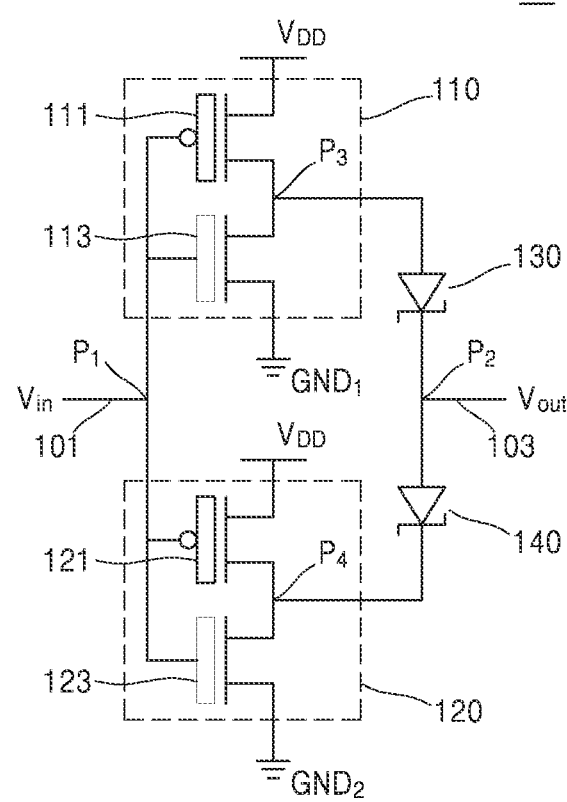
FIG. 2 is a circuit diagram for describing a configuration of the ternary logic circuit illustrated in FIG. 1.

FIG. 2 is a circuit diagram for describing a configuration of the ternary logic circuit 10 illustrated in FIG. 1.

Referring to FIG. 2, the first inverter unit 110 may include a first transistor 111 and a second transistor 113, and the second inverter unit 120 may include a third transistor 121 and a fourth transistor 123.

The first transistor 111 is arranged in series with the second transistor 113. The gate electrode of the first transistor 111 and the gate electrode of the second transistor 113 may branch off from the first point $P_1$. Accordingly, gate electrodes of the first transistor 111 and the second transistor 113 may receive the same input voltage Vin.

One electrode of the first transistor 111 may be connected to the first operation electrode 105 of FIG. 1, and the other electrode thereof may be connected to a third point $P_3$. One electrode of the second transistor 113 may be connected to the third point $P_3$, and the other electrode thereof may be connected to the first ground electrode $GND_1$. At the third point $P_3$, the first transistor 111, the second transistor 113, and the first junction unit 130 are electrically connected to each other.

The first transistor 111 may include a transistor having a p-type channel, and the second transistor 113 may include a transistor having an n-type channel. The first transistor 111 may have a first threshold voltage $-V_H$, and the second transistor 113 may have a second threshold voltage $V_L$. Here, the first threshold voltage $-V_H$ may have a negative value, and the second threshold voltage $V_L$ may have a positive value. Also, an absolute value $|V_H|$ of the first threshold voltage $-V_H$ may be greater than an absolute value $|V_L|$ of the second threshold voltage $V_L$.

The third transistor 121 is arranged in series with the fourth transistor 123. The gate electrode of the third transistor 121 and the gate electrode of the fourth transistor 123 may branch off at the first point $P_1$ and be electrically connected to the input terminal 101. Accordingly, the third transistor 121 and the fourth transistor 123 may receive the same input voltage Vin.

One electrode of the third transistor 121 may be connected to the second operation electrode 107 of FIG. 1, and the other electrode thereof may be connected to a fourth point $P_4$. One electrode of the fourth transistor 123 may be connected to the fourth point $P_4$, and the other electrode thereof may be connected to the second ground electrode $GND_2$. At the fourth point $P_4$, the third transistor 121, the fourth transistor 123, and the second junction unit 140 are electrically connected to each other.

The third transistor 121 may include a transistor having a p-type channel, and the fourth transistor 123 may include a transistor having an n-type channel. The third transistor 121 may have a third threshold voltage $-V_L$, and the fourth transistor 123 may have a fourth threshold voltage $V_H$. Here, an absolute value $|V_L|$ of the third threshold voltage $-V_L$ may be less than the absolute value $|V_H|$ of the fourth threshold voltage $V_H$.

Here, the first transistor 111, the second transistor 113, the third transistor 121, and the fourth transistor 123 may include carbon nanotube transistors.

The first transistor 111 and the third transistor 121 may include p-type carbon nanotube transistors that use, as a channel, carbon nanotubes doped p-type. The second transistor 113 and the fourth transistor 123 may include n-type carbon nanotube transistors that use, as a channel, carbon nanotubes doped n-type. The first transistor 111 and the fourth transistor 123 may use, as a channel, carbon nanotubes having a first diameter. The second transistor 113 and the third transistor 121 may use, as a channel, carbon nanotubes having a second diameter. The first diameter may be less than the second diameter.

The first junction unit 130 electrically connects the output end of the first inverter unit 110 to the second point $P_2$, and the second junction unit 140 connects the second point $P_2$ to the output end of the second inverter unit 120. The second point $P_2$ is electrically connected to the output terminal 103.

The first junction unit 130 may be arranged to have a p-type region in a direction to the output end of the first inverter unit 110 and an n-type region in a direction to the second point $P_2$. The second junction unit 140 may be arranged to have a p-type region in the direction to the second point $P_2$ and an n-type region in a direction to the output end of the second inverter unit 120. The first junction unit 130 and the second junction unit 140 may include a highly doped tunnel junction, and may have negative resistance characteristics.

When the absolute value of the input voltage Vin is greater than the first input voltage and less than the second input voltage, the first junction unit 130 and the second junction unit 140 distribute, by using a tunnel current, a voltage applied to the first junction unit 130 and the second junction unit 140. Accordingly, a value of the second output voltage output to the output terminal 103 may be half of a value of the operation voltage ($V_{DD}/2$).

The first junction unit 130 and the second junction unit 140 may include a carbon nanotube tunnel PN junction. The carbon nanotube tunnel PN junction may have a first region that is highly doped with an n-type dopant and a second region that is highly doped with a p-type dopant. The carbon nanotube tunnel PN junction may be doped at at least $3 \times 10^{18}$ cm$^{-3}$. An electric field applied to the first junction unit 130 and the second junction unit 140 may be about 1 MV/cm or more, or 1 MV/cm.

Figure 3:
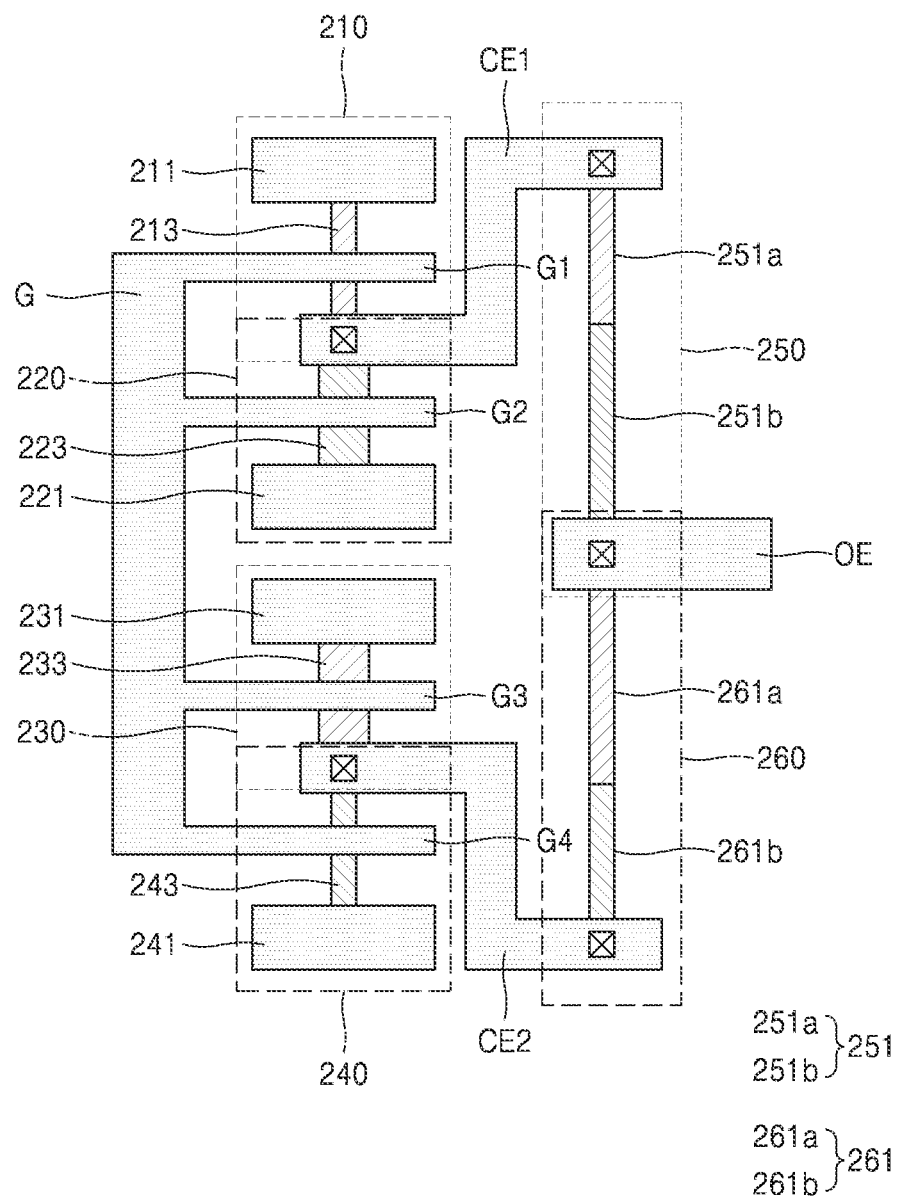
FIG. 3 is a conceptual diagram illustrating a ternary logic circuit using carbon nanotubes, according to an embodiment of the present disclosure.

FIG. 3 is a conceptual diagram illustrating a ternary logic circuit using carbon nanotubes, according to an embodiment of the present disclosure.

Referring to FIG. 3, a ternary logic circuit 20 using carbon nanotubes, according to an embodiment of the present disclosure, may include a first transistor portion 210 and a second transistor portion 220 that are arranged in series and share a first common electrode CE1, a third transistor portion 230 and a fourth transistor portion 240 that are arranged in series and share a second common electrode CE2, a gate electrode G for applying a gate voltage to the first to fourth transistor portions 210 to 240, an output electrode OE connected to an output terminal, a first junction portion 250 connecting the first common electrode CE1 to the output electrode OE, and a second junction portion 260 connecting the second common electrode CE2 to the output electrode OE.

The first transistor portion 210 may include a first operation electrode 211, the first common electrode CE1, and a first carbon nanotube channel 213 arranged between the first operation electrode 211 and the first common electrode CE1.

The second transistor portion 220 may include the first common electrode CE1 shared with the first transistor portion 210, a first ground electrode 221, and a second carbon nanotube channel 223 arranged between the first common electrode CE1 and the first ground electrode 221.

The third transistor portion 230 may include a second operation electrode 231, the second common electrode CE2, and a third carbon nanotube channel 233 arranged between the second operation electrode 231 and the second common electrode CE2.

The fourth transistor portion 240 may include the second common electrode CE2, a second ground electrode 241, and a fourth carbon nanotube channel 243 arranged between the second common electrode CE2 and the second ground electrode 241.

The first carbon nanotube channel 213 and the third carbon nanotube channel 233 may include undoped carbon nanotubes or p-type carbon nanotubes doped with a p-type dopant. The second carbon nanotube channel 223 and the fourth carbon nanotube channel 243 may include n-type carbon nanotubes doped with an n-type dopant.

The first carbon nanotube channel 213 and the fourth carbon nanotube channel 243 may include carbon nanotubes having a first diameter, and the second carbon nanotube channel 223 and the third carbon nanotube channel 233 may include carbon nanotubes having a second diameter. The first diameter may be less than the second diameter.

The gate electrode G may include branch electrodes G1, G2, G3, and G4 arranged on respective partial regions of the first carbon nanotube channel 213, the second carbon nanotube channel 223, the third carbon nanotube channel 233, and the fourth carbon nanotube channel 243. Accordingly, the gate electrode G may be used to simultaneously apply the same input voltage Vin to the partial regions of the first carbon nanotube channel 213, the second carbon nanotube channel 223, the third carbon nanotube channel 233, and the fourth carbon nanotube channel 243.

One side of the first common electrode CE1 is electrically connected to the first carbon nanotube channel 213 and the second carbon nanotube channel 223 at a point where one side end of the first carbon nanotube channel 213 is adjacent to one side end of the second carbon nanotube channel 223. The other side of the first common electrode CE1 is electrically connected to a first carbon nanotube junction 251.

One side of the second common electrode CE2 is electrically connected to the third carbon nanotube channel 233 and the fourth carbon nanotube channel 243 at a point where one side end of the third carbon nanotube channel 233 is adjacent to one side end of the fourth carbon nanotube channel 243. The other side of the second common electrode CE2 is electrically connected to a second carbon nanotube junction 261.

The first junction unit 250 includes the first common electrode CE1, the output electrode OE, and the first carbon nanotube junction 251 arranged between the first common electrode CE1 and the output electrode OE.

The first carbon nanotube junction 251 may include a first region 251a doped with a p-type dopant and a second region 251b doped with an n-type dopant. Here, the first region 251a and the second region 251b may be highly doped. The first region 251a and the second region 251b may be doped at a concentration of at least $3 \times 10^{18}$ cm$^{-3}$. In an embodiment, lengths of the first region 251a and the second region 251b may be different from each other. For example, the first region 251a may be shorter than the second region 251b.

The second junction unit 260 includes the second common electrode CE2, the output electrode OE, and the second carbon nanotube junction 261 arranged between the second common electrode CE2 and the output electrode OE.

The second carbon nanotube junction 261 may include a third region 261a doped with a p-type dopant and a fourth region 261b doped with an n-type dopant. Likewise, the third region 261a and the fourth region 261b may be highly doped. The third region 261a and the fourth region 261b may be doped at a concentration of at least $3 \times 10^{18}$ cm$^{-3}$. In an embodiment, lengths of the third region 261a and the fourth region 261b may be different from each other. For example, the third region 261a may be longer than the fourth region 261b.

Figure 4:
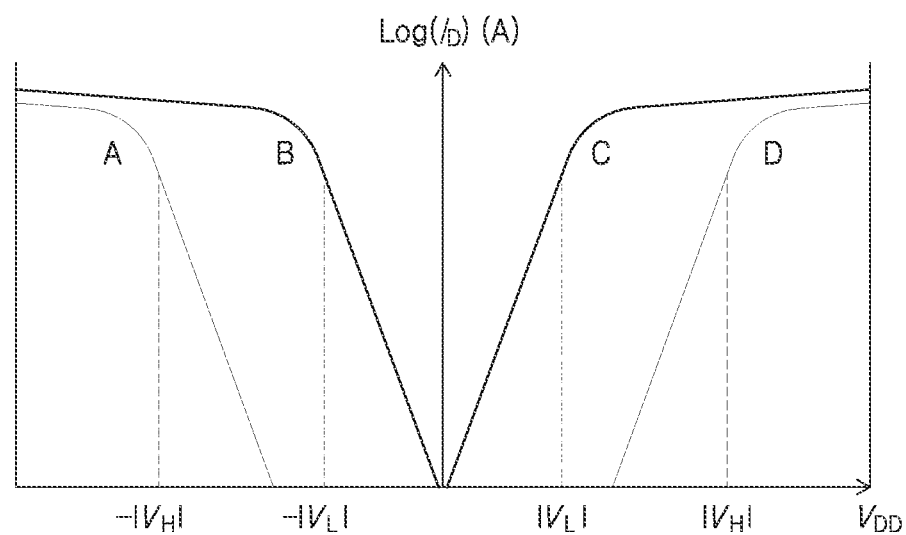
FIG. 4 is a graph showing the magnitude of current flowing through each transistor according to an applied gate voltage.

FIG. 4 is a graph showing the magnitude of a current flowing through each transistor according to an applied gate voltage.

Referring to FIG. 4, according to an input voltage applied to the gate electrode G, A indicates a current flowing through the first transistor unit 210, B indicates a current flowing through the third transistor unit 230, C denotes a current flowing through the second transistor unit 220, and D denotes a current flowing through the fourth transistor unit 240.

The absolute value $|V_H|$ of threshold voltages of the first transistor unit 210 and the fourth transistor unit 240, which include carbon nanotubes having the first diameter, are the same, and the absolute values $|V_L|$ of threshold voltages of the second transistor unit 220 and the third transistor unit 230, which include carbon nanotubes having the second diameter, are the same. Here, the first diameter is less than the second diameter, and $|V_L|<|V_H|$.

The first transistor unit 210 and the third transistor unit 230, which have a p-type carbon nanotube channel, maintain an on state below a threshold voltage value, and when the applied gate voltage is equal to or higher than the threshold voltage value, the current rapidly decreases to be in an OFF state.

The second transistor unit 220 and the fourth transistor unit 240, which have an n-type carbon nanotube channel, maintain an OFF state below the threshold voltage value, and when the applied gate voltage is equal to or higher than the threshold voltage value, the current rapidly increases to be in an ON state.

Figure 5A:
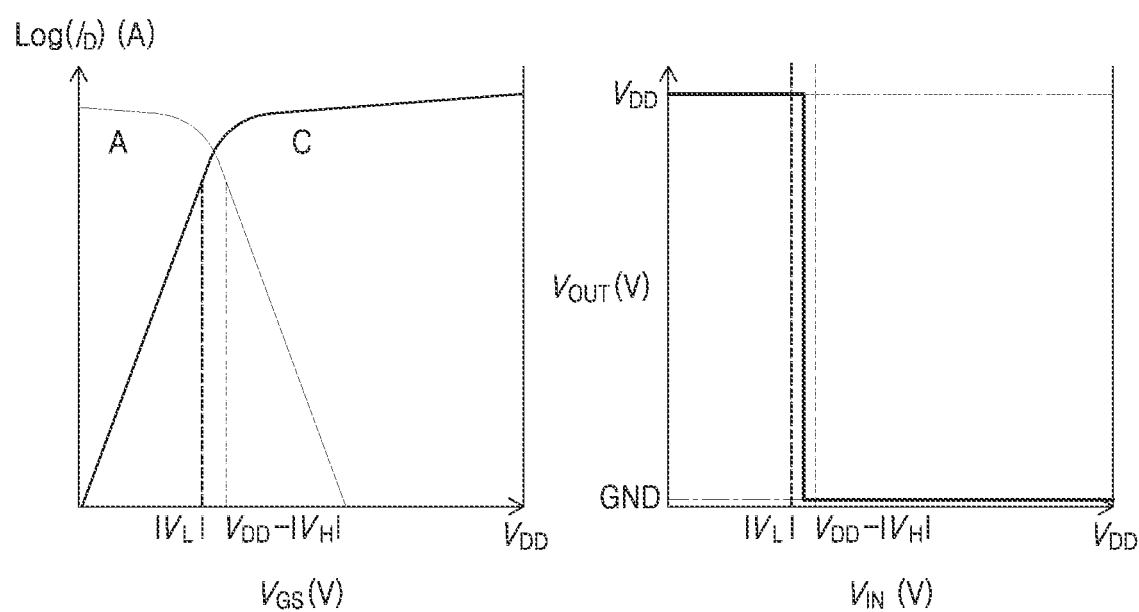
FIG. 5A is a graph for describing an operation of a first inverter unit.
Figure 5B:
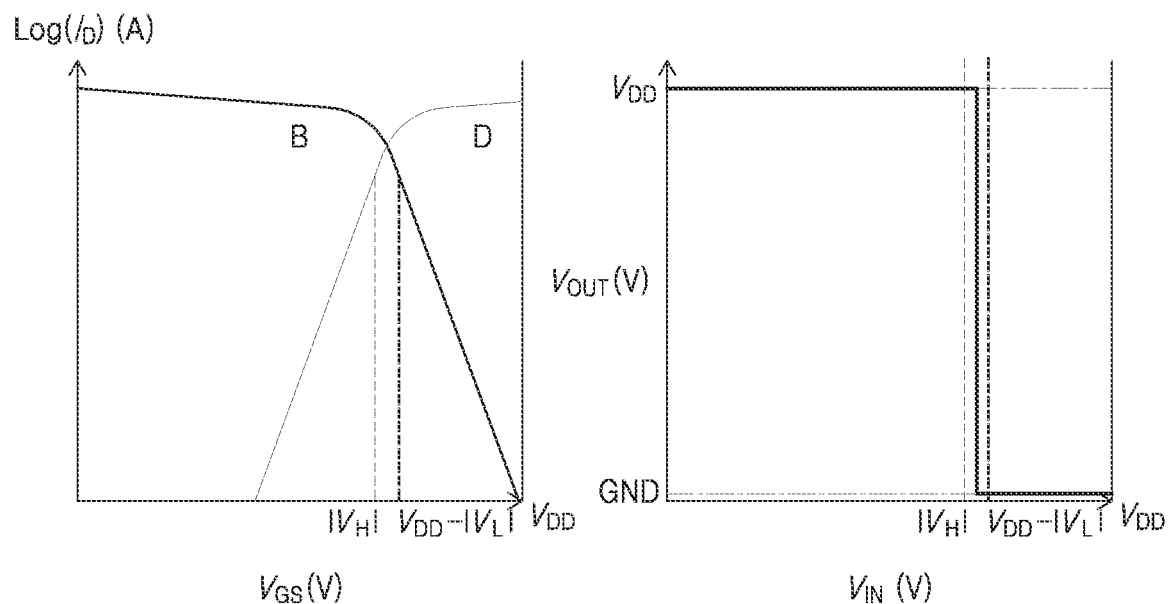
FIG. 5B is a graph for describing an operation of a second inverter unit.

FIG. 5A is a graph for describing an operation of a first inverter unit, and FIG. 5B is a graph for describing an operation of a second inverter unit.

Referring to FIG. 5A, when the input voltage Vin is applied to the first inverter unit 110 (FIG. 1), and the absolute value of the input voltage Vin is equal to a difference between the operation voltage $V_{DD}$ and the absolute value $|V_H|$ of the first threshold voltage ($V_{DD}-|V_H|$), a current value of the first transistor unit 210 rapidly decreases, and when the absolute value of the input voltage Vin is equal to the absolute value $|V_L|$ of the second threshold voltage, a current value of the second transistor unit 220 rapidly increases.

Accordingly, at the first input voltage or lower, which is a point where A, which is a graph of current of the first transistor unit 210, and C, which is a graph of current of the second transistor unit 220, intersect each other, the first inverter unit 110 outputs a voltage which has a same magnitude as the operation voltage $V_{DD}$, and when the absolute value of the input voltage Vin exceeds the first input voltage, the first inverter unit 110 is changed to a state of outputting a voltage which has a same magnitude as the ground voltage GND.

Referring to FIG. 5B, when the input voltage Vin is applied to the second inverter unit 120 (FIG. 1), and the absolute value of the input voltage Vin is equal to a difference between the operation voltage $V_{DD}$ and the absolute value $|V_L|$ of the third threshold voltage ($V_{DD}-|V_L|$), a current value of the third transistor unit 230 rapidly decreases, and when the absolute value of the input voltage Vin is equal to the absolute value $|V_H|$ of the fourth threshold voltage, a current value of the fourth transistor unit 240 rapidly increases.

Accordingly, at a second input voltage or lower, which is a point where B, which is a graph of current of the third transistor unit 230, and D, which is a graph of current of the fourth transistor unit 240 intersect each other, the second inverter unit 120 outputs a voltage which has a same magnitude as the operation voltage $V_{DD}$, and when the absolute value of the input voltage Vin exceeds the second input voltage, the second inverter unit 120 is changed to a state of outputting a voltage which has a same magnitude as the ground voltage GND.

Figure 6:
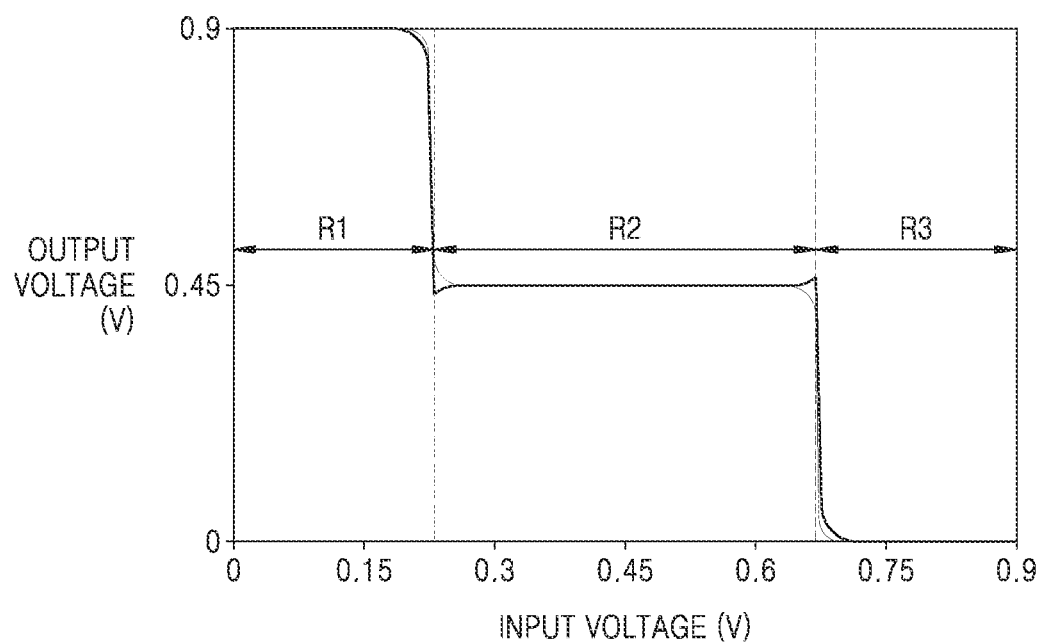
FIG. 6 is a graph showing a relationship between an input voltage and an output voltage of a carbon nanotube-based ternary logic circuit, according to an embodiment of the present disclosure.

FIG. 6 is a graph showing a relationship between the input voltage Vin and the output voltage Vout of a carbon nanotube-based ternary logic circuit according to an embodiment of the present disclosure.

Referring to FIG. 6, the carbon nanotube-based ternary logic circuit according to an embodiment of the present disclosure outputs the first output voltage $V_{DD}$ (0.9 V) of the same magnitude as an operation voltage in a region R1 in which the absolute value of the input voltage Vin is from 0 to the first input voltage.

In a second region R2 in which the absolute value of the input voltage Vin has a value between the first input voltage and the second input voltage, the carbon nanotube-based ternary logic circuit outputs a second output voltage (0.45 V), which is half of the operation voltage $V_{DD}$.

In a third region R3 in which the absolute value of the input voltage Vin is greater than the second input voltage, the carbon nanotube-based ternary logic circuit outputs the third output voltage GND (0 V) having the same magnitude as the ground voltage.

Figure 7A:
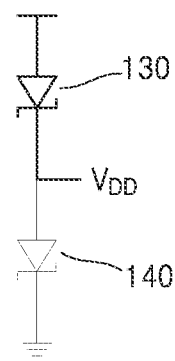
FIGS. 7A to 7C are conceptual diagrams for describing operation of a first junction unit and a second junction unit in respective states illustrated in FIG. 6.
Figure 7B:
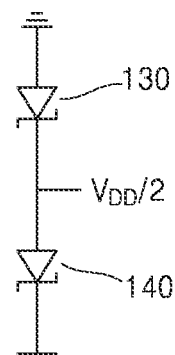
Figure 7C:
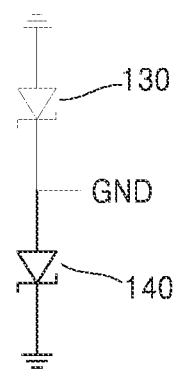

FIGS. 7A to 7C are conceptual diagrams for describing operation of a first junction unit and a second junction unit in respective states illustrated in FIG. 6.

Referring to FIG. 7A, in the first region R1 (FIG. 6), the first inverter unit 110 and the second inverter unit 120 output the same voltage $V_{DD}$, and the first junction unit 130 outputs the first output voltage $V_{DD}$ to the output terminal 103.

Referring to FIG. 7B, in the second region R2, the first inverter unit 110 outputs the ground voltage GND, and the second inverter unit 120 outputs the operation voltage $V_{DD}$. The first junction unit 130 and the second junction unit 140 equally distribute a voltage between both ends thereof by using a tunnel current, and output the second output voltage ($V_{DD}/2$) to the output terminal 103.

Referring to FIG. 7C, in the third region R3, the first inverter unit 110 and the second inverter unit 120 output the ground voltage GND. Accordingly, the output terminal 103 outputs the third output voltage GND (0 V) having the same magnitude as the ground voltage GND.

Figure 8:
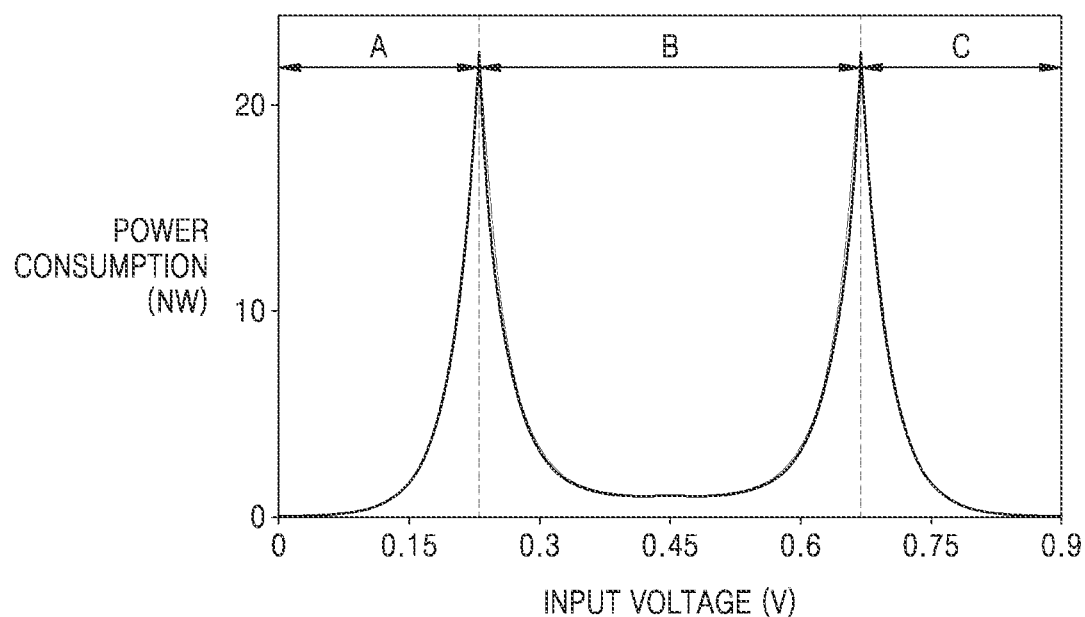
FIG. 8 is a graph showing power consumption of a ternary logic circuit using carbon nanotubes, according to an embodiment of the present disclosure.

FIG. 8 is a graph showing power consumption of the ternary logic circuit using carbon nanotubes, according to an embodiment of the present disclosure.

Referring to FIG. 8, in the carbon nanotube-based ternary logic circuit according to an embodiment of the present disclosure, power consumption of only several nanowatts to several tens of nanowatts occurs at a point adjacent to the first input voltage and the second input voltage, in which the output state is changed, and power consumption for maintaining each state is only a few picowatts to several nanowatts. Accordingly, the carbon nanotube-based ternary logic circuit according to an embodiment of the present disclosure consumes very little power, thereby enabling a ternary-based operation.

In addition, according to the carbon nanotube-based ternary logic circuit according to an embodiment of the present disclosure, by using only carbon nanotube-based transistors and PN junctions and without using additional components such as resistors, inductors, and capacitors, devices may be made compact and a high integration degree may be obtained, accordingly.

The ternary logic circuit according to an embodiment of the present disclosure may output three voltage values to realize ternary information by using the first inverter unit, the second inverter unit, the first junction unit, and the second junction unit.

Here, regardless of a level of the input voltage Vin, the first junction unit and the second junction unit may implement a second output voltage ($V_{DD}/2$), which is an intermediate value between the first output voltage $V_{DD}$ and the third output voltage GND, by using a tunneling current.

In addition, according to an embodiment of the present disclosure, the first inverter unit and the second inverter unit may be configured using carbon nanotube transistors, thus allowing to easily determine a threshold voltage of each transistor. In addition, by forming the first junction unit and the second junction unit by using carbon nanotube tunnel PN junctions, the ternary logic circuit having a compact size may be formed, and circuit complexity may be reduced.

The technical effects of the present disclosure are not limited to those described above, and other technical effects not described herein will be clearly understood by those skilled in the art from the following description.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A ternary logic circuit comprising:
a first inverter unit electrically connected to an input terminal and an output terminal;
a second inverter unit electrically connected to the input terminal and the output terminal and arranged in parallel with the first inverter unit;
a first junction unit arranged between the first inverter unit and the output terminal and including a tunnel PN junction; and
a second junction unit arranged between the second inverter unit and the output terminal and including a tunnel PN junction,
wherein, the first inverter unit includes a first transistor having a first threshold voltage and a second transistor that is arranged in series with the first transistor and has a second threshold voltage,
the second inverter unit includes a third transistor having a third threshold voltage and a fourth transistor that is arranged in series with the third transistor and has a fourth threshold voltage,
the first transistor and the third transistor include a p-type channel, and the second transistor and the fourth transistor include an n-type channel, and
when an absolute value of an input voltage applied to the input terminal is less than a first input voltage, the output terminal outputs a first output voltage, and when the absolute value of the input voltage is greater than the first input voltage and less than a second input voltage, the output terminal outputs a second output voltage, and when the absolute value of the input terminal is greater than the second input voltage, the output terminal outputs a third output voltage.

2. The ternary logic circuit of claim 1, wherein an absolute value of the first threshold voltage is equal to an absolute value of the fourth threshold voltage, and
an absolute value of the second threshold voltage is equal to an absolute value of the third threshold voltage.

3. The ternary logic circuit of claim 1, wherein the first transistor, the second transistor, the third transistor, and the fourth transistor comprise carbon nanotube transistors.

4. The ternary logic circuit of claim 3, wherein the first transistor and the fourth transistor comprise carbon nanotubes having a first diameter,
the second transistor and the third transistor comprise carbon nanotubes having a second diameter, and
the first diameter is less than the second diameter.

5. The ternary logic circuit of claim 1, wherein the first junction unit and the second junction unit include a carbon nanotube tunnel PN junction.

6. The ternary logic circuit of claim 5, wherein an electric field applied to the carbon nanotube tunnel PN junction is equal to or greater than 1 MV/cm.

7. The ternary logic circuit of claim 5, wherein the carbon nanotube tunnel PN junction has a first region that is highly doped with an n-type dopant and a second region that is highly doped with a p-type dopant.

8. The ternary logic circuit of claim 7, wherein the carbon nanotube tunnel PN junction is doped at at least $3 \times 10^{18}$ cm$^{-3}$.

9. The ternary logic circuit of claim 5, wherein, when the absolute value of the input voltage is greater than an absolute value of the first input voltage and less than an absolute value of the second input voltage, the carbon nanotube tunnel PN junction distributes a voltage by using a tunneling current.

10. The ternary logic circuit of claim 1, wherein the first output voltage has a same magnitude as an operation voltage $V_{DD}$, and
the second output voltage has half the magnitude as the operation voltage $V_{DD}/2$, and
the third output voltage has the same magnitude as a ground voltage.

* * * * *